(12) United States Patent
Takeuchi et al.

(10) Patent No.: US 7,788,061 B2
(45) Date of Patent: Aug. 31, 2010

(54) SUBSTRATE AND MASK ALIGNING APPARATUS

(75) Inventors: Yukiharu Takeuchi, Nagano (JP); Hideaki Sakaguchi, Nagano (JP)

(73) Assignee: Shinko Electric Industries Co., Ltd., Nagani-shi (JP)

( * ) Notice: Subject to any disclaimer, the term of this patent is extended or adjusted under 35 U.S.C. 154(b) by 0 days.

(21) Appl. No.: 12/178,767

(22) Filed: Jul. 24, 2008

(65) Prior Publication Data

US 2009/0030640 A1   Jan. 29, 2009

(30) Foreign Application Priority Data

Jul. 26, 2007    (JP) .............................. 2007-194343

(51) Int. Cl.
*G01C 17/00*   (2006.01)
(52) U.S. Cl. ...................................... 702/150
(58) Field of Classification Search .................. 702/150
See application file for complete search history.

(56) References Cited

U.S. PATENT DOCUMENTS

| | | | |
|---|---|---|---|
| 2004/0261977 A1* | 12/2004 | Allen et al. | 165/96 |
| 2006/0086321 A1* | 4/2006 | Brody et al. | 118/720 |
| 2007/0251089 A1 | 11/2007 | Kawamura et al. | |
| 2008/0202421 A1* | 8/2008 | Allen et al. | 118/720 |

FOREIGN PATENT DOCUMENTS

JP    2005-166859    6/2005

* cited by examiner

*Primary Examiner*—Aditya Bhat
(74) *Attorney, Agent, or Firm*—Rankin, Hill & Clark LLP (57) ABSTRACT

A substrate and mask aligning apparatus includes a controlling portion 70 for calculating moving data that are applied to eliminate a difference between a present superposed state of the through holes 52 of the mask 50, which comes into contact with the substrate 20 that is loaded on the stage 30, on the pads 22 of the substrate 20 and a scheduled superposed state on the basis of image data from the shooting section 40, 42 and then executing repeatedly an operation to move the stage 30 on the basis of the calculated moving data of the stage.

12 Claims, 6 Drawing Sheets

SUBSTRATE AND MASK ALIGNING APPARATUS

BACKGROUND OF THE INVENTION

The present invention relates to a substrate and mask aligning apparatus and, more particularly, a substrate and mask aligning apparatus for attaining precise alignment by conducting a substrate and mask alignment while checking a state that the mask is aligned actually with the substrate.

In the field of the apparatus that mounts solder balls on solder ball mounting pads on a substrate, such an apparatus is widely used that the solder balls are mounted on the solder ball mounting pads on the substrate respectively, by superposing a mask in which opening portions are provided in solder ball connecting pad portions on the substrate and then dropping the solder ball into the opening portions respectively.

Nowadays a diameter dimension of the solder balls that are mounted on the substrate becomes fine to an extent of about 80 μm. Therefore, positions of the solder balls and a strict aligned state between the substrate and the mask used to mount the solder balls on the substrate cannot be checked with the naked eye. For this reason, the solder ball mounting apparatus capable of checking a mask aligned state with the substrate and a solder ball mounted state on the substrate by shooting images of the substrate and the mask by means of a shooting section such as a camera, or the like, and then processing image data has been provided (see Patent Literature 1, for example).

[Patent Literature 1] JP-A-2005-166859

In aligning the mask with the substrate, in many cases the substrate is aligned with the mask on the basis of alignment information obtained by shooting in advance the substrate and the mask as a single body respectively. In this event, the same mask is used continuously from the beginning as the mask, while the new substrate a shrinkage level and a distortion level of which are different respectively is supplied each time. Also, upon superposing the mask on the substrate, these members are superposed mutually in a state that a tension is being applied to the mask. In such situation, when the mask and the substrate are aligned with each other on the basis of previously picked-up image data of the substrate and the mask, such a problem exists that positions of the pads on the substrate are deviated unexpectedly from positions of the opening portions of the mask.

SUMMARY OF THE INVENTION

Therefore, it is an object of the invention of this application to provide a substrate and mask aligning apparatus capable of aligning a position of a substrate with a position of a mask precisely and quickly, by shooting respective plan images of the substrate and the mask to calculate their schematic positions every time when alignment is done and then calculating moving date composed of schematic alignment information of the substrate and the mask, and then shooting again respective plan images in a state that the substrate and the mask are superposed actually and then calculating correction moving data required for precise alignment between the substrate and the mask.

According to a first aspect of the invention, there is provided a substrate and mask aligning apparatus including:

a stage on which a substrate is loaded on one surface side such that a pad forming surface on which a plurality of pads are formed is directed upward and which is provided to move on a horizontal plane and provided to turn on a same plane;

a mask in which through holes are formed in portions corresponding to pads on the substrate that is loaded on the stage;

a connecting/disconnecting mechanism for connecting/disconnecting at least one of the substrate or the mask to/from the other;

a shooting section for shooting a superposed state of the through holes of the mask on the pads of the substrate in a state that the mask is brought into contact with the pad forming surface of the substrate loaded on the stage; and a controlling portion for calculating stage moving data which includes a moving direction and an amount of movement of the stage, on the basis of image data picked up by the shooting section to eliminate a difference between a present superposed state of the through holes of the mask which comes into contact with the pad forming surface of the substrate loaded on the stage, on the pads of the substrate and a scheduled superposed state, and executing repeatedly an operation to move the stage on the basis of calculated moving data of the stage.

According to a second aspect of the invention, there is provided a substrate and mask aligning apparatus including:

a stage on which a substrate is loaded on one surface side such that a pad forming surface on which a plurality of pads are formed is directed upward;

a mask in which through holes are formed in portions corresponding to pads on the substrate that is loaded on the stage;

a mask moving mechanism provided to move the mask on a horizontal plane, and provided to turn on a same plane;

a connecting/disconnecting mechanism for connecting/disconnecting at least one of the substrate or the mask to/from the other;

a shooting section for shooting a superposed state of the through holes of the mask on the pads of the substrate in a state that the mask is brought into contact with the pad forming surface of the substrate loaded on the stage; and a controlling portion for calculating mask moving data which includes a moving direction and an amount of movement of the mask moving mechanism, on the basis of image data picked up by the shooting section to eliminate a difference between a present superposed state of the through holes of the mask which comes into contact with the pad forming surface of the substrate loaded on the stage, on the pads of the substrate and a scheduled superposed state, and executing repeatedly an operation to move the mask moving mechanism on the basis of calculated moving data of the mask.

According to a third aspect of the invention, there is provided the substrate and mask aligning apparatus according to the first or second aspect, wherein first moving data necessary for first alignment between positions of the through holes of the mask and the pad forming surface of the substrate are calculated on the basis of both the image data of the sole substrate obtained by shooting the pad forming surface in a state that the substrate is loaded on the stage and the image data of the sole mask obtained by shooting a plane state of the sole mask.

As a result, a calculating time required in aligning the pad forming surface of the substrate with the positions of the through holes of the mask for the first time can be shortened, and the aligning process can be performed effectively.

According to a forth aspect of the invention, there is provided the substrate and mask aligning apparatus according to any one of the first to third aspects, wherein the shooting section is constructed by at least two section, a first shooting section shoots an image of the pad forming surface in a state that the substrate is loaded on the stage, and a second shooting section shoots a plane image of the mask and also shoots a plane image in a state that the pad forming substrate of the substrate is brought into contact with the mask on the basis of the first moving data.

Therefore, there is no need to move the shooting section, and the pad forming surface of the substrate and the mask can be shot in fixed positions. As a result, no displacement is caused in the image data and the image data processing can be performed precisely, and the aligning process can be made more efficient.

According to a fifth aspect of the invention, there is provided the substrate and mask aligning apparatus according to any one of the first to forth aspects, wherein a plurality of pad groups each of which is constructed by arranging a plurality of pads in a matrix fashion are arranged on the substrate in a square matrix fashion, and in calculating the moving data of the stage or the moving data of the mask, the controlling portion extracts respective images of two pad groups, between which a separation distance becomes longest, out of the pad groups positioned at outermost peripheral corner portions of the pad groups in the image data picked up in a state that the mask is brought into contact with the pad forming surface of the substrate, and calculates the moving data on the basis of extracted image data.

Therefore, positional relationships between the pad forming positions and the through hole forming positions in positions where the positional displacement is caused easily can be adjusted. As a result, a practical alignment accuracy can be realized in a short time.

According to a sixth aspect of the invention, there is provided the substrate and mask aligning apparatus according to any one of the first to forth aspects, wherein a plurality of pad groups each of which is constructed by arranging a plurality of pads in a matrix fashion are arranged on the substrate in a square matrix fashion, and in calculating the moving data of the stage or the moving data of the mask, the controlling portion extracts images of the pad groups positioned at all corner portions in an outermost periphery of the pad groups in the image data picked up in a state that the mask is brought into contact with the pad forming surface of the substrate, and calculates the moving data on the basis of extracted image data.

Therefore, the positional relationships between the pad forming positions and the through hole forming positions in positions where the positional displacement is caused easily can be adjusted. As a result, a practical alignment accuracy can be realized in a short time, and thus a alignment accuracy can be enhanced not to extremely increase a load on the computing section.

According to a seventh aspect of the invention, there is provided the substrate and mask aligning apparatus according to the fifth or sixth aspect, wherein in calculating the moving data of the stage or the moving data of the mask, the controlling portion calculates moving data elements of the stage or moving data elements of the mask by applying a calculation individually to the extracted pad groups in the image data picked up in a state that the mask is brought into contact with the pad forming surface of the substrate, and then sets an average value of the moving data elements of the stage or the moving data elements of the mask as the moving data of the stage or the moving data of the mask.

Therefore, the alignment process can be performed while keeping a total balance between the substrate and the mask.

As a result, the alignment process can be performed with accuracy at an available level in a short time.

According to the substrate and mask aligning apparatus according to the present invention, the moving data applied to move the substrate or the mask to a predetermined state are calculated on the basis of the image data derived in a state that the mask is superposed actually on the substrate. Therefore, the moving data that is more precise than the moving data calculated on the basis of the image data picked up solely respectively can be calculated, and as a result the substrate can be aligned precisely with the mask in a short time.

DETAILED DESCRIPTION OF THE PREFERRED EMBODIMENTS

Embodiments of a substrate and mask aligning apparatus according to the present invention will be explained with reference to the drawings hereinafter. In the present embodiments, a substrate and mask aligning apparatus according to the present invention will be explained.

First Embodiment

Figure 1:
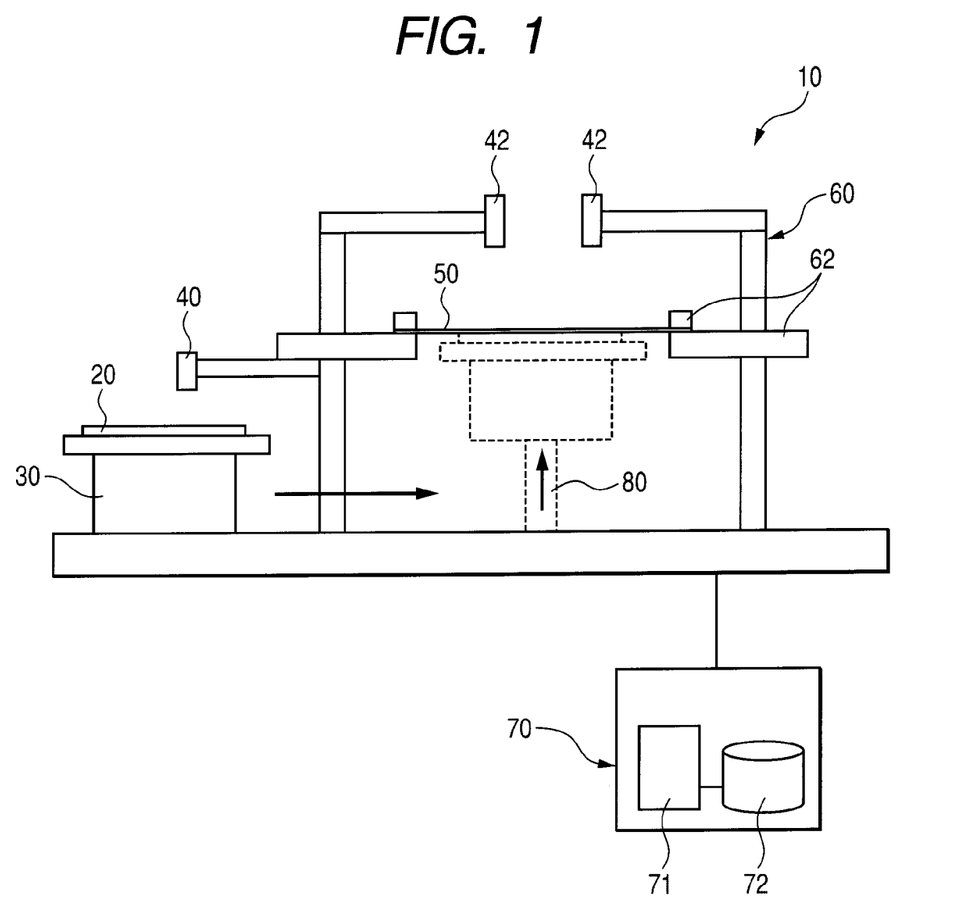
FIG. 1 is a view showing a schematic configuration of a substrate and mask aligning apparatus in a first embodiment.
Figure 2:
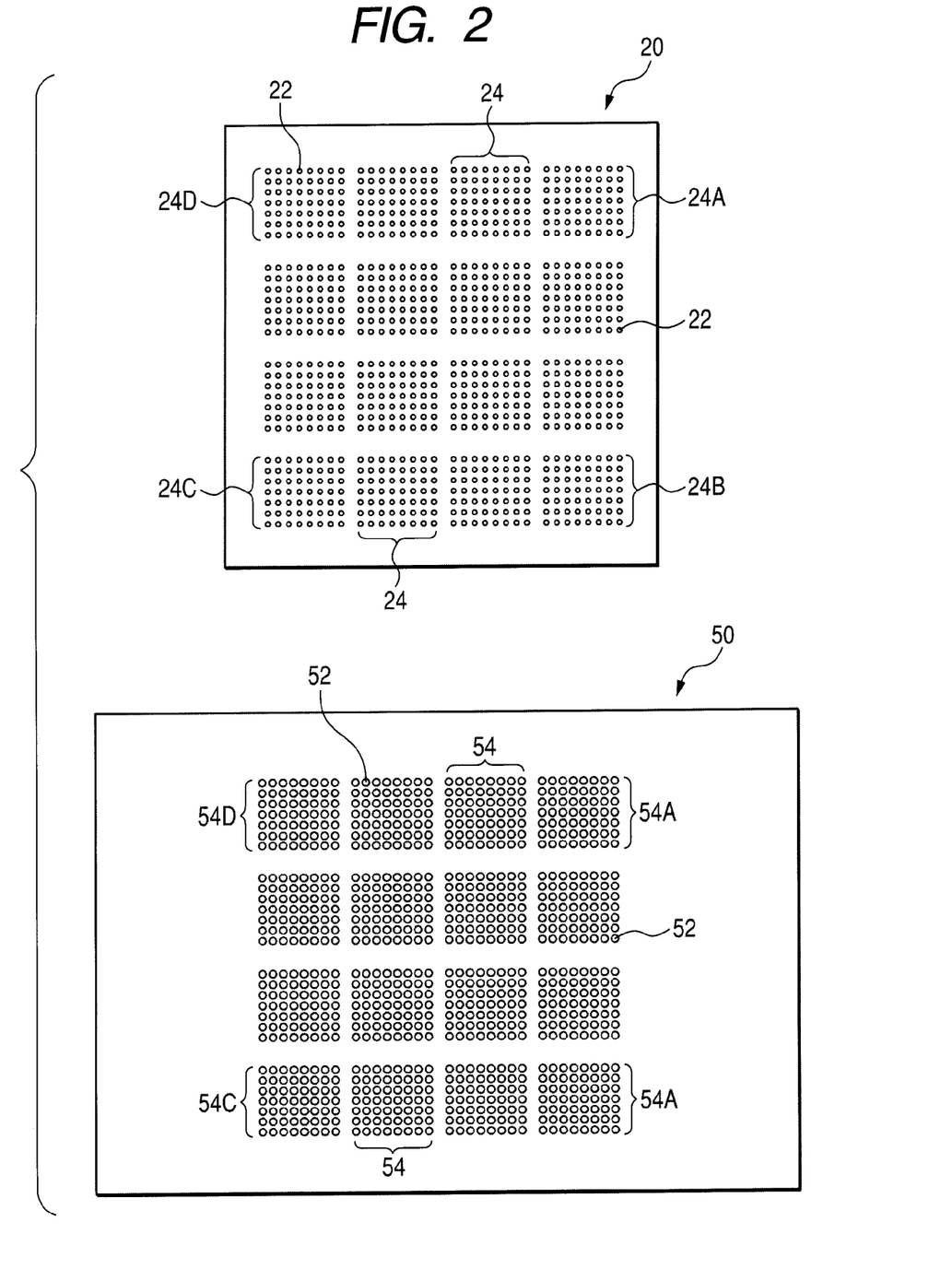
FIG. 2 is a plan view of a substrate and a mask.
Figure 3:
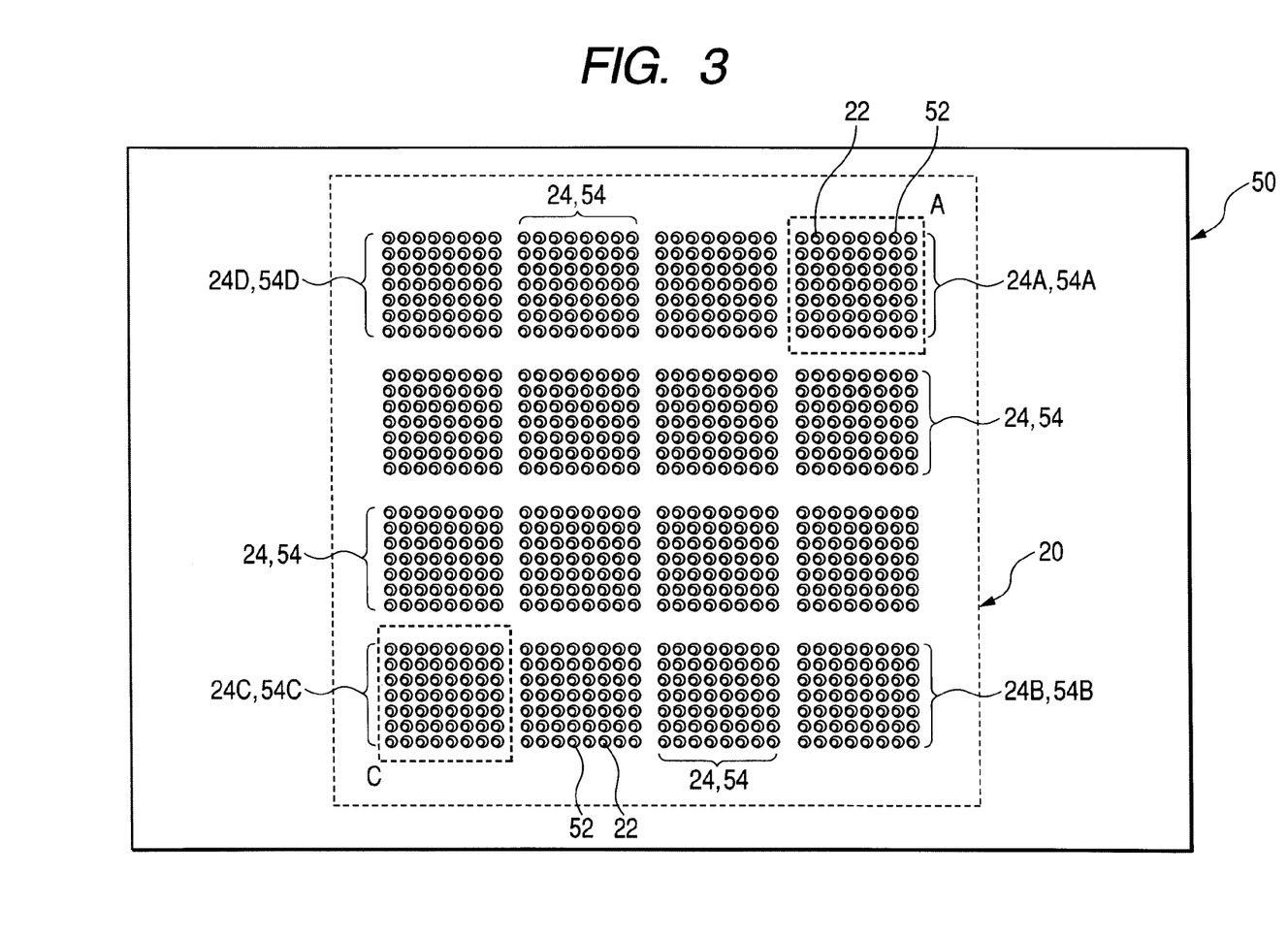
FIG. 3 is a plan view showing a state that a mask is brought into contact with a pad forming surface of a substrate.
Figure 4:
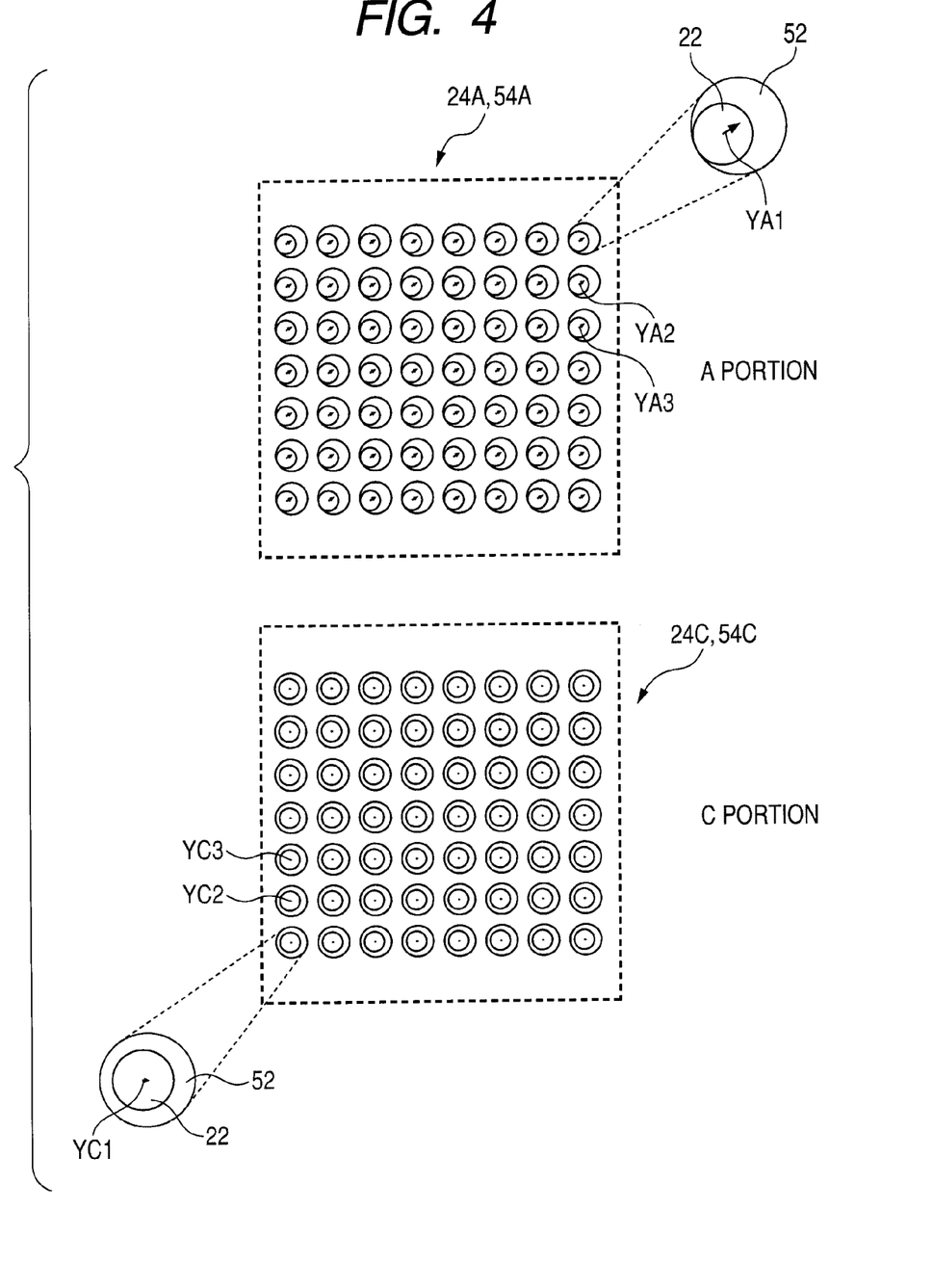
FIG. 4 is an enlarged view of an A portion and a C portion in FIG. 3.

FIG. 1 is a view showing a schematic configuration of a substrate and mask aligning apparatus in a first embodiment. FIG. 2 is a plan view of a substrate and a mask. FIG. 3 is a plan view showing a state that the mask is brought into contact with a pad forming surface of the substrate. FIG. 4 is an enlarged view of an A portion and a C portion in FIG. 3.

As shown in FIG. 1, a substrate and mask aligning apparatus 10 in the present embodiment includes a stage 30 for sucking/holding a substrate 20, a first camera 40 as a first shooting section arranged over the substrate 20 that is sucked/held on the stage 30, and a frame 60 for holding a mask 50 and second cameras 42 as a second shooting section for shooting the mask 50 from the top respectively. The first camera 40 and the second cameras 42 are connected to a controlling portion 70. The controlling portion 70 calculates data, which are used to move the stage 30 such that a position of the substrate 20 is aligned with a position of the mask 50, on the basis of image data that the first camera 40 and the second cameras 42 shoot.

As shown in FIG. 2, pad groups 24 in which respective pads 22 are aligned like a matrix fashion are arranged on an upper surface of the substrate 20 in the present embodiment. The pad groups 24 constitute a pad forming surface of the substrate 20 in a state that these pad groups 24 are arranged like a square matrix fashion. The first camera 40 for shooting an image of the pad forming surface of the substrate 20 is arranged over the pad forming surface of the substrate 20. The first camera 40 and the second cameras 42 in the present embodiment are fixed to the frame 60, as shown in FIG. 1. The first camera 40 is arranged on the outside of a planar area of the frame 60 in a position where this camera can shoot the pad forming surface of the substrate 2, and also the second cameras 42 are arranged in positions where these cameras can shoot a plane image of the mask 50.

The substrate 20 is sucked/held on the stage 30 by the air suction, or the like. The stage 30 can be moved on the horizontal plane in X, Y directions and provided turnably in the same plane. The stage 30 in the present embodiment sucks/holds the substrate 20 in a position on the outside of a plane area of the frame 60, then the first camera 40 shoots the plane image of the pattern forming surface, then the stage 30 moves to a position under the position where the mask 50 is held, and then a connecting/disconnecting mechanism 80 moves upwardly to superpose the pattern forming surface of the substrate 20 on the lower surface of the mask 50.

The mask 50 is formed of a thin metal plate and, as shown in FIG. 2, through holes 52 passing through the mask 50 in the thickness direction are formed. The through holes 52 are formed such that center positions of the through holes 52 coincide with center portions of the pads 22 of the substrate 20. Therefore, the through holes 52 of the mask 50 are arranged in a matrix fashion to constitute a through hole group 54, and the through hole groups 54 are arranged in a square matrix fashion. The mask 50 is held detachably on a mask holding portion 62 of the frame 60. Once the mask 50 is held on the mask holding portion 62, such mask 50 is never displaced.

The digital camera is preferably used as the first camera 40 and the second cameras 42, but these cameras 40, 42 are not limited to the digital camera. Both the first camera 40 and the second cameras 42 are provided to send picked-up image data to the controlling portion 70. As the controlling portion 70, a personal computer having a CPU 71 and a storing section 72 into which an image processing software is incorporated can be employed. The controlling portion 70 causes the storing section 72 to store once the image data picked up by the first camera 40 and the second cameras 42 therein, and then causes the CPU 71 to calculate the first moving data. This first moving data is used to move the stage 30 in bringing the pad forming surface of the substrate 20 into contact with the mask 50 on the basis of respective image data. The first moving data is composed of direction data indicating a direction along which the stage 30 is to be moved, distance data indicating a distance over which the stage 30 is to be moved, and turning angle data indicating an angle by which the stage 30 is to be turned. The controlling portion 70 moves the stage 30 over a predetermined distance in a predetermined direction on the basis of the first moving data, and then turns the stage 30 at a predetermined angle. In this case, the publicly known approach can be employed as the computing algorithm that is used to calculate the first moving data on the basis of the image data of the first camera 40 and the second cameras 42.

Normally the mask 50 is supported in a state that no tension is applied, but a predetermined tension is applied in superposing the mask 50 on the substrate 20. Therefore, even when the mask 50 is superposed on the substrate 20 by using the first moving data that are calculated on the basis of the plane image of the mask 50 picked up in a state that no tension is applied, it is feared that the center positions of the pads 22 should not coincide precisely with the center positions of the through holes 52, nevertheless the substrate 20 and the mask 50 can be positioned roughly.

The controlling portion 70 moves the stage 30 in a predetermined position on the basis of the first moving data, then brings the pad forming surface of the substrate 20 into contact with the lower surface of the mask 50, then aligns roughly the positions of the pads 22 and the positions of the through holes 52, and then superposes the mask 50 on the substrate 20, as shown in FIG. 3. Then, the second cameras 42 shoots the plane image in a state that the mask 50 is superposed on the substrate 20, from the top of the mask 50. The picked-up plane image is stored in the storing section 72 of the controlling portion 70. The controlling portion 70 checks the aligned state between the pads 22 of the substrate 20 and the through holes 52 of the mask 50, on the basis of the image data of the plane image stored in the storing section 72 and picked up in a state that the mask 50 is superposed on the substrate 20.

Then, the controlling portion 70 checks positional relationships between the pads 22 of the substrate 20 and the through holes 52 of the mask 50, on the basis of the image data stored in the storing section 72 and picked up in a state that the mask 50 is superposed on the substrate 20. Also, in order to eliminate a difference between a superposed state of the through holes 52 and the pads 22 at the present time and a scheduled superposed state, the controlling portion 70 causes the CPU 71 to calculate corrected moving data used to correct the position of the stage 30 on which the substrate 20 is loaded. Like the first moving data, the corrected moving data is also composed of direction data indicating a direction along which the stage 30 is to be moved, distance data indicating a distance over which the stage 30 is to be moved, and turning angle data indicating an angle by which the stage 30 is to be turned.

The publicly known approach can be employed as the image processing algorithm applied in calculating the corrected moving data.

A large number of pads 22 are formed on the substrate 20. Therefore, if the corrected moving data about all pads 22 are calculated on the basis of the image data of the corresponding through holes 52 respectively to get the positional matching between all pads 22 and all through holes 52, a huge time is needed and thus such approach is unpractical. For this reason, in the present embodiment, the corrected moving data concerning only pad groups 24A, 24C and through hole groups 54A, 54C, which are positioned at two locations to constitute a diagonal line on respective planes of the substrate 20 and the mask 50, out of pad groups 24, 24, . . . of the substrate 20 and through hole groups 54, 54, . . . of the mask 50 are calculated on the basis of the image data.

Concretely, as shown in FIG. 4, in the pad groups positioned at outermost peripheral corner portions out of the pad groups 24, 24, . . . arranged in a square shape, the CPU 71 extracts individually the image data about the pad groups 24A, 24C and the through hole groups 54A, 54C in two locations between which a separation distance becomes longest (positioned on the diagonal line of the pad groups provided in a square shape), and stores such image data in the storing section 72. Then, in the pads 22, 22, . . . and the through holes 52, 52, . . . constituting the pad groups 24A, 24C and the through hole groups 54A, 54C respectively, the CPU 71 calculates elementary elements YA1, YA2, . . . and YC1, YC2, . . . as the moving data that make the center positions of the pads 22 coincide with the center positions of the through holes 52, on the basis of individually extracted image data respectively. Then, the CPU 71 sets average values of respective elementary elements as corrected moving data elements (YA, YC (not shown)), and then employs average values of the corrected moving data elements (YA, YC) as the corrected moving data. In this manner, when the number of the portions to which the image data processing is applied is reduced, an image processing time in the controlling portion 70 can be shortened drastically. As a result, a quick aligning process of the substrate 20 with the mask 50 can be done advantageously.

As described above, the controlling portion 70 adjusts finely the position of the stage 30 on the basis of the corrected moving data, and shoots again the plane images of the finely adjusted superposed state of the mask 50 on the substrate 20 by the second cameras 42 after the fine adjustment performed on the basis of the corrected moving data, and then stores the plane images in the storing section 72.

Figure 5:
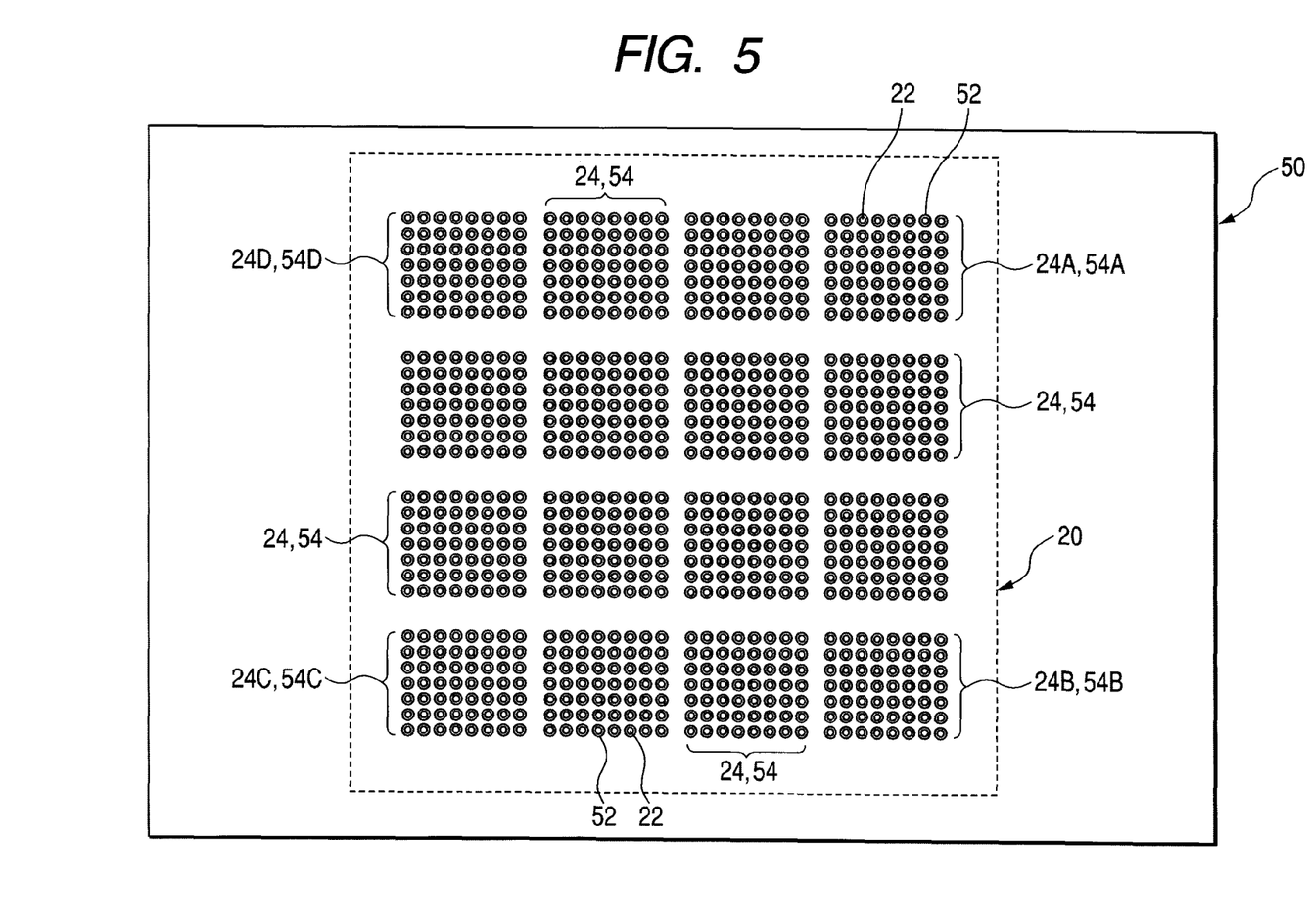
FIG. 5 is a plan view showing a state that center positions of all pads coincide perfectly with center positions of all through holes (ideal state).

The controlling portion 70 causes the CPU 71 to calculate the corrected moving data by using the latest image data out of the image data of the plane images in the superposed state of the mask 50 on the substrate 20. If convergence conditions of the corrected moving data and upper limit data of the number of calculation times of the corrected moving data are stored in advance in the storing section 72, the controlling portion 70 can decide objectively whether or not the calculation of the next corrected moving data should be performed, by referring to the convergence conditions of the corrected moving data, the number of calculation times of the corrected moving data, and its upper limit data stored in the storing section 72. The controlling portion 70 causes the CPU 71 to execute repeatedly the shooting of the plane image by the second cameras 42 and the calculation of the corrected moving data based on the picked-up image data until previously set conditions can be satisfied. FIG. 5 is a plan view showing a state that center positions of all pads coincide perfectly with center positions of all through holes (ideal state).

Second Embodiment

In the first embodiment, the substrate 20 is aligned roughly with the mask 50 on the basis of the first moving data, then the plane image of the superposed state of the mask 50 on the substrate 20 is shot by the second cameras 42, and then the controlling portion 70 applies the image data processing to the pad groups 24A, 24C and the through hole groups 54A, 54C in two locations of the outermost peripheral portion positioned on the diagonal line of the pad groups 24 and the through hole groups 54 arranged in a square shape out of the shot image data of the substrate 20 and the mask 50 respectively. Therefore, the controlling portion 70 calculates elementary elements YA1, YA2, ... and YC1, YC2, ... respectively, sets calculated average values of the elementary elements as the corrected moving data elements (YA, YC), and then employs average values of the corrected moving data elements (YA, YC) as the corrected moving data.

In contrast, in the present embodiment, the controlling portion 70 applies the image data processing to the image data about pad groups 24A, 24B, 24C, 24D and through hole groups 54A, 54B, 54C, 54D, which are located at four corner portions out of the pad groups 24, 24, ... and through hole groups 54, 54, ... arranged in the outermost peripheral portion of the planes of the substrate 20 and the mask 50, by the same approach as that in the first embodiment, then calculates corrected moving data elements (YA, YB, YC, YD) in the pad groups 24A, 24B, 24C, 24D and the through hole groups 54A, 54B, 54C, 54D respectively, and then employs average values of the calculated corrected moving data elements (YA, YB, YC, YD) as the corrected moving data. Therefore, the number of calculation times of the corrected moving data can be reduced advantageously in contrast to the first embodiment.

Third Embodiment

In the first embodiment, such a configuration is employed that the stage 30 on which the substrate 20 is loaded can be moved in the X, Y directions and can be turned in the X-Y plane. But the present embodiment is different from the first embodiment in that the stage 30 on which the substrate 20 is loaded is fixed and a mask moving mechanism (not shown) on which the mask 50 is loaded and which can be moved in the X, Y directions on the plane and can be turned in the same plane is employed. In the present embodiment, since the stage 30 on which the substrate 20 is loaded is fixed, the connecting/disconnecting mechanism for connecting/disconnecting the mask 50 to/from the substrate 20 loaded on the stage 30 is incorporated into the mask moving mechanism. Other configurations are similar to those in the first embodiment. In the present embodiment, it is of course that the controlling portion 70 should perform a process of aligning positions of the through holes 52 of the mask 50 with positions of the pads 22 of the substrate 20, by moving the mask moving mechanism on the basis of the moving data including the first moving data and the corrected moving data.

Figure 6:
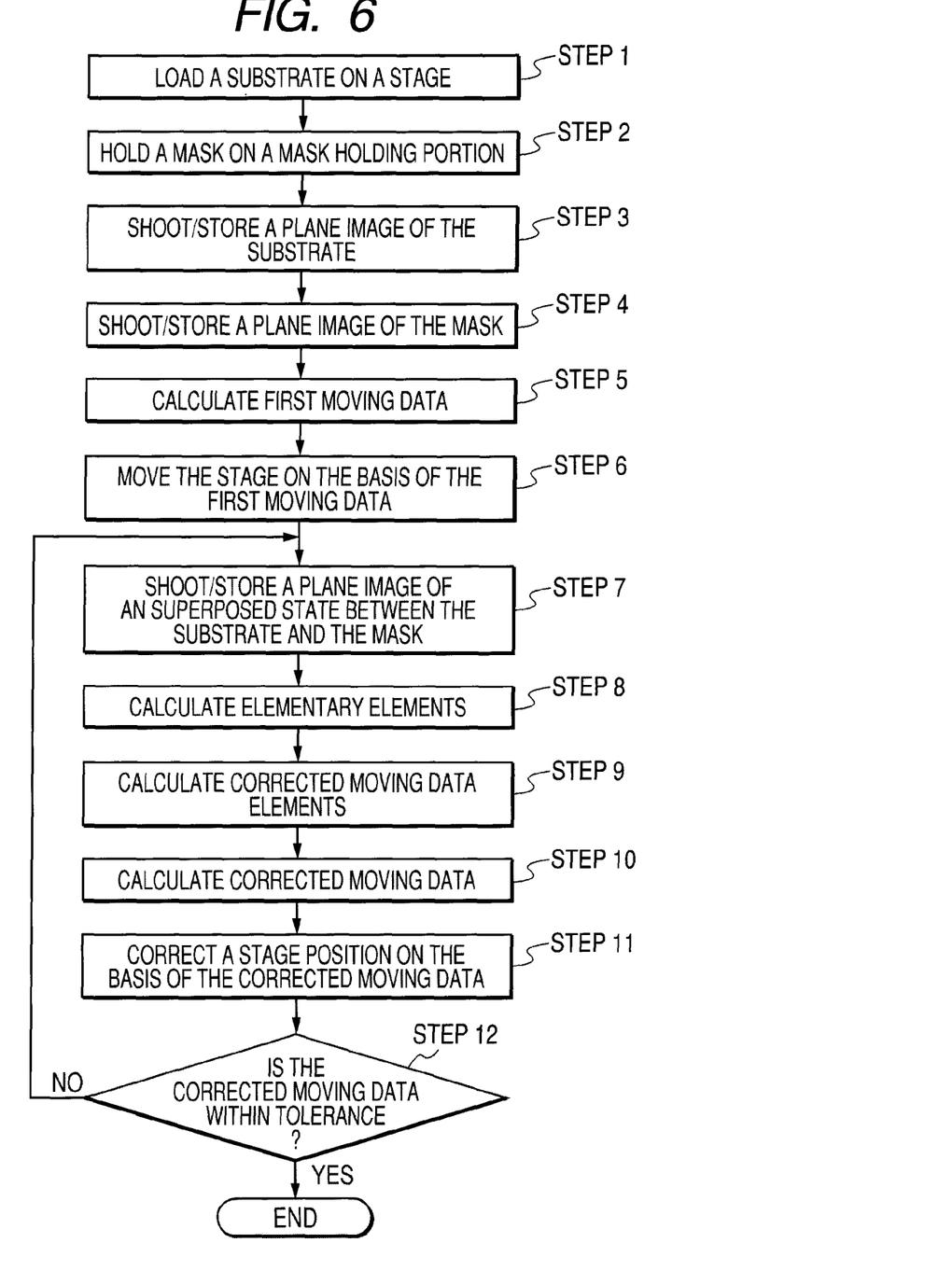
FIG. 6 is a flowchart showing procedures of a substrate and mask aligning method of the present embodiment.

With the above, embodiments of the substrate and mask aligning apparatus 10 according to the present invention is explained. Next, a substrate and mask aligning method using the substrate and mask aligning apparatus according to the present invention will be explained hereunder. FIG. 6 is a flowchart showing procedures of a substrate and mask aligning method of the present embodiment.

First, the substrate 20 is loaded on the stage 30 such that the pad forming surface on which the pad groups 24 composed of the pads 22 formed in a matrix fashion are arranged in a square matrix fashion is directed upward, and then the substrate 20 is held by the air suction (step 1). Then, hold the mask 50 in which the through holes 52 are formed in the positions corresponding to the positions of the pads 22 of the substrate 20 is fixed to the mask holding portion 62 (step 2). After the substrate 20 and the mask 50 are held in this manner, the plane image of the pad forming surface of the substrate 20 is shot by the first camera 40, and the picked-up image data is stored in the storing section 72 of the controlling portion 70 (step 3). Also, the plane image of the mask 50 is shot by the second cameras 42, and also the picked-up image data is stored in the storing section 72 of the controlling portion 70 (step 4).

The controlling portion 70 causes the CPU 71 to process the image data, which are obtained by shooting the substrate 20 and the mask 50 individually, by the publicly known method respectively and to calculate the first moving data that are used to align the positions of the through holes 52 of the mask 50 with the positions of the pads 22 formed on the substrate 20 (step 5). After the first moving data are obtained, the controlling portion 70 superposes the pad forming surface of the substrate 20 on the mask 50 by moving the stage 30 in a predetermined direction over a predetermined distance and also turning the stage 30 on the horizontal plane in a predetermined direction by a predetermined angle on the basis of the first moving data (step 6). Then, the controlling portion 70 causes the second cameras 42 to shoot the plane image in a state that the through holes 52 of the mask 50 and the pads 22 of the substrate 20 are superposed and to store the picked-up image data in the storing section 72 (step 7).

The controlling portion 70 reads the image data of a superposed state of the through holes 52 of the mask 50 on the pads 22 of the substrate 20 from the storing section 72, causes the CPU 71 to process the image data about the portions corresponding to the pad groups 24A, 24C and the through hole groups 54A, 54C in two outermost peripheral locations existing on the diagonal line of the square shape in the portions positioned at outermost peripheral portions of the pad groups 24 of the substrate 20 and the through hole groups 54 of the mask 50, calculates an amount of displacement between center positions of the through holes 52 in the through hole groups 54A, 54C and center positions of the underlying pads 22 in the pad groups 24A, 24C respectively, and calculates the elementary elements as the moving data used to eliminate an amount of displacement between the center positions of the through holes 52 and the center positions of the pads 22 at the present time respectively (step 8). The controlling portion 70 calculates the corrected moving data elements by averaging the calculated elementary elements (step 9). Also, the controlling portion 70 calculates the corrected moving data by averaging the calculated corrected moving data elements (step 10). Then, the controlling portion 70 executes the control to correct the position of the stage 30 on the basis of the corrected moving data calculated in this manner (step 11).

The controlling portion 70 decides whether or not the value of the corrected moving data is within tolerance data stored in advance in the storing section 72 (step 12). Thus, the controlling portion 70 decides whether or not the next corrected moving data should be calculated. If the value of the corrected moving data is less than the tolerance data (if Yes), the alignment between the substrate 20 and the mask 50 is completed (END). In contrast, if the value of the corrected moving data is in excess of the tolerance data (if No), processes in step 7 to step 10 are done repeatedly. If repetition limiting data for limiting the maximum number of repetition times in calculating the corrected moving data is stored in the storing section 72, the number of repetition times of step 7 to step 10 can be limited favorably.

With the above, the invention of this application is explained on the basis of the embodiments. The substrate and mask aligning apparatus 10 according to the invention of this application is not limited to the configuration in the embodiments explained as above. It is of course that various modes in which various variations are applied within a scope not to change a gist of the invention may belong to the technical scope of the invention of this application.

For example, in the foregoing embodiments, such a method of calculating the corrected moving data is employed that, only in calculating the corrected moving data, the controlling portion 70 applies the image processing to only a part of the image data of the pad groups 24, 24, . . . formed on the substrate 20 and the through hole groups 54, 54 . . . formed in the mask 50. In this case, the similar calculating method may also be applied to the first moving data. Also, it is of course that, in aligning the mask 50 with the substrate 20 in a situation that the CPU 71 of the controlling portion 70 has a high computing ability, the mode of carrying out the data processing by using always the overall image data of the image data picked up in a state that the mask 50 is superposed on the substrate 20 may be employed.

Also, the substrate 20 in which the pad groups 24 composed by forming the pads 22 like a matrix are arranged in a square matrix fashion and the mask 50 in which the through hole groups 54 composed by forming the through holes 52 like a matrix are arranged in a square matrix fashion are explained as above. In this case, it is of course that the pads 22 formed on the substrate 20 and the through holes 52 formed in the mask 50 may be arranged in a mode except a matrix alignment. In such case, in calculating the first moving data and/or the corrected moving data, it is as in the present embodiment that a calculating time can be shortened by applying the image processing to only a part of the image data.

Also, in calculating the first moving data or the corrected moving data, the first moving data elements or the corrected moving data elements are calculated respectively, and then the first moving data or the corrected moving data are obtained by applying a simple average to them. In this case, when the first moving data elements or the corrected moving data elements are three pieces or more, the first moving data or the corrected moving data can be derived by applying a weighted average process to respective data elements to conform to tendencies of respective data elements of the first moving data or the corrected moving data. When such calculating method is employed, it is advantageous that a process of aligning the through holes 52 of the mask 50 with the pads 22 of the substrate 20 can be done more effectively.

The present invention is suitably applicable in particular to the solder ball mounting apparatus of the substrate, the solder paste coating apparatus of the substrate, and the like.

What is claimed is:

1. A substrate and mask aligning apparatus comprising:
a stage on which a substrate is loaded on one surface side such that a pad forming surface on which a plurality of pads are formed is directed upward and which is provided to move on a horizontal plane and provided to turn on a same plane;
a mask in which through holes are formed in portions corresponding to pads on the substrate that is loaded on the stage;
a connecting/disconnecting mechanism for connecting/disconnecting at least one of the substrate or the mask to/from the other;
a shooting section for shooting a superposed state of the through holes of the mask on the pads of the substrate in a state that the mask is brought into contact with the pad forming surface of the substrate loaded on the stage; and
a controlling portion for calculating stage moving data, which includes a moving direction and an amount of movement of the stage, on the basis of image data picked up by the shooting section to eliminate a difference between a present superposed state of the through holes of the mask, which comes into contact with the pad forming surface of the substrate loaded on the stage, on the pads of the substrate and a scheduled superposed state, and for executing repeatedly an operation to move the stage on the basis of calculated corrected moving data of the stage;
wherein first moving data necessary for first alignment between positions of the through holes of the mask and the pad forming surface of the substrate is calculated on the basis of both the image data of the sole substrate obtained by shooting the pad forming surface in a state that the substrate is loaded on the stage and the image data of the sole mask obtained by shooting a plane state of the sole mask, and
wherein the first moving data is calculated using data obtained in a state where no tension is applied to a mask, and the corrected moving data is calculated using data obtained in a state where a tension is applied to the mask.

2. The substrate and mask aligning apparatus according to claim 1, wherein the shooting section is constructed by at least two section, namely:
a first shooting section that shoots an image of the pad forming surface in a state that the substrate is loaded on the stage; and
a second shooting section that shoots a plane image of the mask and also that shoots a plane image in a state that the pad forming substrate of the substrate is brought into contact with the mask on the basis of the first moving data.

3. The substrate and mask aligning apparatus according to claim 1, wherein
a plurality of pad groups each of which is constructed by arranging a plurality of pads in a matrix fashion are arranged on the substrate in a square matrix fashion, and
in calculating the corrected moving data of the stage, the controlling portion extracts respective images of two pad groups, between which a separation distance becomes longest, out of the pad groups positioned at outermost peripheral corner portions of the pad groups in the image data picked up in a state that the mask is brought into contact with the pad forming surface of the substrate, and calculates the moving data on the basis of extracted image data.

4. The substrate and mask aligning apparatus according to claim 3, wherein
in calculating the corrected moving data of the stage, the controlling portion calculates moving data elements of the stage by applying a calculation individually to the extracted pad groups in the image data picked up in a state that the mask is brought into contact with the pad forming surface of the substrate, and then sets an average value of the moving data elements of the stage as the corrected moving data of the stage.

5. The substrate and mask aligning apparatus according to claim 1, wherein
a plurality of pad groups each of which is constructed by arranging a plurality of pads in a matrix fashion are arranged on the substrate in a square matrix fashion, and
in calculating the corrected moving data of the stage, the controlling portion extracts images of the pad groups positioned at all corner portions in an outermost periphery of the pad groups in the image data picked up in a state that the mask is brought into contact with the pad forming surface of the substrate, and calculates the corrected moving data on the basis of extracted image data.

6. The substrate and mask aligning apparatus according to claim 5, wherein
in calculating the corrected moving data of the mask, the controlling portion calculates moving data elements of the mask by applying a calculation individually to the extracted pad groups in the image data picked up in a state that the mask is brought into contact with the pad forming surface of the substrate, and then sets an average value of the moving data elements of the mask as the corrected moving data of the mask.

7. A substrate and mask aligning apparatus comprising:
a stage on which a substrate is loaded on one surface side such that a pad forming surface on which a plurality of pads are formed is directed upward;
a mask in which through holes are formed in portions corresponding to pads on the substrate that is loaded on the stage;
a mask moving mechanism provided to move the mask on a horizontal plane, and provided to turn on a same plane;
a connecting/disconnecting mechanism for connecting/disconnecting at least one of the substrate or the mask to/from the other;
a shooting section for shooting a superposed state of the through holes of the mask on the pads of the substrate in a state that the mask is brought into contact with the pad forming surface of the substrate loaded on the stage; and
a controlling portion for calculating mask moving data, which includes a moving direction and an amount of movement of the mask moving mechanism, on the basis of image data picked up by the shooting section to eliminate a difference between a present superposed state of the through holes of the mask, which comes into contact with the pad forming surface of the substrate loaded on the stage, on the pads of the substrate and a scheduled superposed state, and for executing repeatedly an operation to move the mask moving mechanism on the basis of calculated corrected moving data of the mask;
wherein first moving data necessary for first alignment between positions of the through holes of the mask and the pad forming surface of the substrate is calculated on the basis of both the image data of the sole substrate obtained by shooting the pad forming surface in a state that the substrate is loaded on the stage and the image data of the sole mask obtained by shooting a plane state of the sole mask, and
wherein the first moving data is calculated using data obtained in a state where no tension is applied to a mask, and the corrected moving data is calculated using data obtained in a state where a tension is applied to the mask.

8. The substrate and mask aligning apparatus according to claim 7, wherein the shooting section is constructed by at least two section, namely
a first shooting section that shoots an image of the pad forming surface in a state that the substrate is loaded on the stage; and
a second shooting section that shoots a plane image of the mask and also that shoots a plane image in a state that the pad forming substrate of the substrate is brought into contact with the mask on the basis of the first moving data.

9. The substrate and mask aligning apparatus according to claim 7, wherein
a plurality of pad groups each of which is constructed by arranging a plurality of pads in a matrix fashion are arranged on the substrate in a square matrix fashion, and
in calculating the corrected moving data of the mask, the controlling portion extracts respective images of two pad groups, between which a separation distance becomes longest, out of the pad groups positioned at outermost peripheral corner portions of the pad groups in the image data picked up in a state that the mask is brought into contact with the pad forming surface of the substrate, and calculates the corrected moving data on the basis of extracted image data.

10. The substrate and mask aligning apparatus according to claim 9, wherein
in calculating the corrected moving data of the mask, the controlling portion calculates moving data elements of the mask by applying a calculation individually to the extracted pad groups in the image data picked up in a state that the mask is brought into contact with the pad forming surface of the substrate, and then sets an average value of the moving data elements of the mask as the moving data of the mask.

11. The substrate and mask aligning apparatus according to claim 7, wherein
a plurality of pad groups each of which is constructed by arranging a plurality of pads in a matrix fashion are arranged on the substrate in a square matrix fashion, and
in calculating the corrected moving data of the mask, the controlling portion extracts images of the pad groups positioned at all corner portions in an outermost periphery of the pad groups in the image data picked up in a state that the mask is brought into contact with the pad forming surface of the substrate, and calculates the corrected moving data on the basis of extracted image data.

12. The substrate and mask aligning apparatus according to claim 11, wherein
in calculating the corrected moving data of the mask, the controlling portion calculates moving data elements of the mask by applying a calculation individually to the extracted pad groups in the image data picked up in a state that the mask is brought into contact with the pad forming surface of the substrate, and then sets an average value of the moving data elements of the mask as the corrected moving data of the mask.

* * * * *

UNITED STATES PATENT AND TRADEMARK OFFICE
CERTIFICATE OF CORRECTION

PATENT NO. : 7,788,061 B2
APPLICATION NO. : 12/178767
DATED : August 31, 2010
INVENTOR(S) : Takeuchi et al.

Page 1 of 1

It is certified that error appears in the above-identified patent and that said Letters Patent is hereby corrected as shown below:

On the Title Page, item (73), under "Assignee", in Column 1, Line 2, delete "Nagani-shi" and insert -- Nagano-shi --

Signed and Sealed this
Twenty-fifth Day of January, 2011

David J. Kappos
*Director of the United States Patent and Trademark Office*